United States Patent
Chang et al.

(10) Patent No.: US 10,979,065 B1
(45) Date of Patent: Apr. 13, 2021

(54) SIGNAL PROCESSING CIRCUIT, IN-MEMORY COMPUTING DEVICE AND CONTROL METHOD THEREOF

(71) Applicant: Taiwan Semiconductor Manufacturing Co., Ltd., Hsinchu (TW)

(72) Inventors: Chin-Ho Chang, Hsinchu (TW); Jaw-Juinn Horng, Hsinchu (TW); Yung-Chow Peng, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/836,923

(22) Filed: Apr. 1, 2020

(51) Int. Cl.
*H03M 1/46* (2006.01)

(52) U.S. Cl.
CPC ........... *H03M 1/462* (2013.01); *H03M 1/466* (2013.01)

(58) Field of Classification Search
CPC .............................. H03M 1/462; H03M 1/466
USPC .................................................. 341/135–170
See application file for complete search history.

(56) References Cited

U.S. PATENT DOCUMENTS

| | | | | |
|---|---|---|---|---|
| 5,621,409 A * | 4/1997 | Cotter | .................... | H03M 1/069 341/122 |
| 5,920,275 A * | 7/1999 | Hester | .................... | H03M 1/206 341/155 |
| 8,604,962 B1 * | 12/2013 | Lewyn | ................ | H03M 1/0863 341/162 |
| 8,786,484 B2 * | 7/2014 | Cheong | .................... | H03M 1/12 341/172 |
| 10,084,467 B1 * | 9/2018 | Chang | ...................... | H03M 1/38 |
| 10,291,251 B1 * | 5/2019 | Innocent | ............. | H03M 1/0692 |
| 10,340,939 B1 * | 7/2019 | Paul | ...................... | H03M 1/468 |
| 10,748,597 B1 * | 8/2020 | Caporale | ............. | G11C 11/2273 |
| 2009/0164587 A1 * | 6/2009 | Gavita | .................. | H04W 8/186 709/206 |
| 2011/0109585 A1 * | 5/2011 | Kwon | ..................... | G06F 3/044 345/174 |
| 2012/0218137 A1 * | 8/2012 | Yoon | ....................... | H03M 1/16 341/172 |
| 2012/0262315 A1 * | 10/2012 | Kapusta | ................ | H03M 1/125 341/110 |

(Continued)

*Primary Examiner* — Lam T Mai
(74) *Attorney, Agent, or Firm* — JCIPRNET

(57) ABSTRACT

A signal processing circuit including a plurality of analog-to-digital conversion circuits, an in-memory computing device, and a control method thereof are provided. Each analog-to-digital conversion circuit includes a reset switch, a capacitor array circuit, a voltage comparator, and a successive approximation circuit. A first terminal of the reset switch receives a first reference voltage, and a second terminal of the reset switch receives an input voltage signal. The capacitor array circuit adjusts the input voltage signal according to a successive approximation control signal to generate an adjusted voltage. The voltage comparator compares the voltage levels of the adjusted voltage and a second reference voltage to generate a comparison signal. The successive approximation circuit generates a successive approximation control signal according to the comparison signal and generates an output digital signal corresponding to the input voltage signal. The capacitor array circuit maintains the input voltage signal during a non-reset stage.

20 Claims, 6 Drawing Sheets

(56) References Cited

U.S. PATENT DOCUMENTS

| | | | | |
|---|---|---|---|---|
| 2013/0120180 | A1* | 5/2013 | Kawahito | H04N 5/378 341/172 |
| 2013/0135129 | A1* | 5/2013 | Chang | H03K 6/00 341/122 |
| 2013/0135134 | A1* | 5/2013 | Lin | H03M 1/1215 341/158 |
| 2013/0194118 | A1* | 8/2013 | Coln | H04N 5/3575 341/155 |
| 2014/0184435 | A1* | 7/2014 | Wang | H03K 5/24 341/161 |
| 2015/0263756 | A1* | 9/2015 | Chiu | H03M 1/0607 341/118 |
| 2016/0134300 | A1* | 5/2016 | Wang | H03M 1/1245 341/172 |
| 2017/0317683 | A1* | 11/2017 | Bandyopadhyay | H03M 3/426 |
| 2018/0254779 | A1* | 9/2018 | Omran | H03M 1/38 |
| 2019/0229747 | A1* | 7/2019 | Linkewitsch | H03M 1/1245 |
| 2019/0383769 | A1* | 12/2019 | Yu | G01N 27/414 |

\* cited by examiner

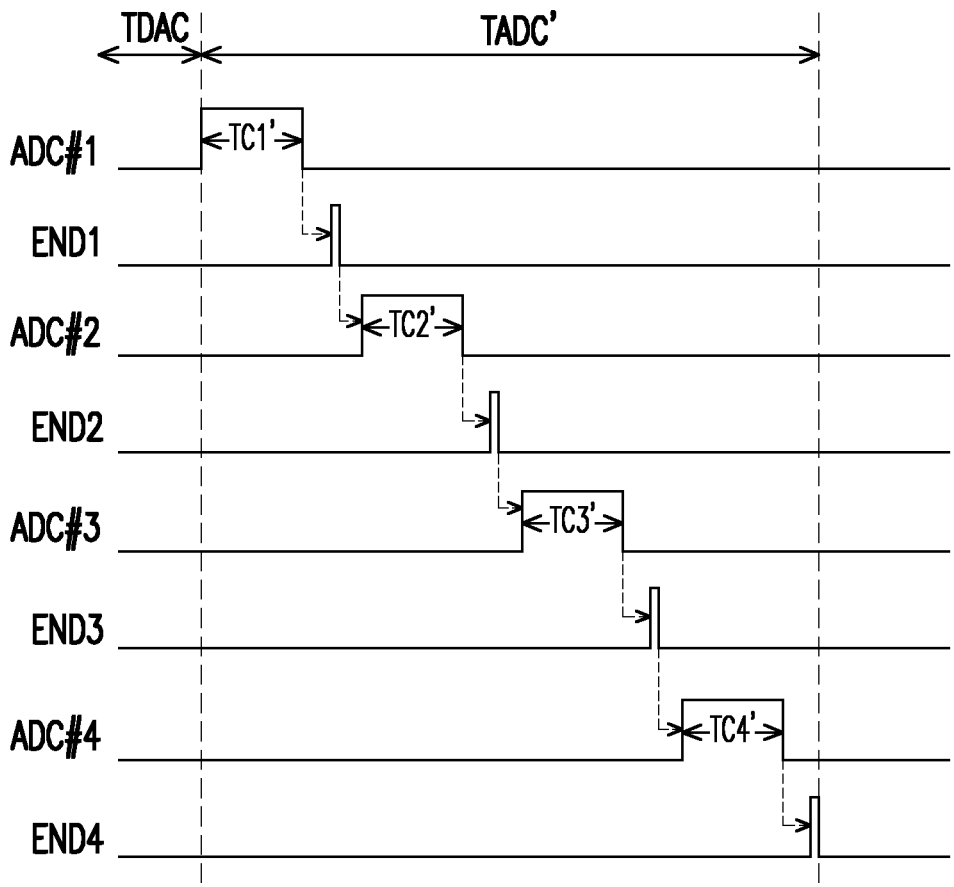

FIG. 7

```
┌─────────────────────────────────────┐
│ Divide the analog-to-digital conversion circuit into │
│ multiple analog-to-digital conversion circuit groups, │──S810
│ wherein each analog-to-digital conversion circuit    │
│ group includes at least two analog-to-digital        │
│ conversion circuits                                  │
└─────────────────────────────────────┘
                    │
                    ▼
┌─────────────────────────────────────┐
│ Control the analog-to-digital conversion circuits so │
│ that during an operation enable period of the        │──S820
│ analog-to-digital conversion circuits, the corresponding │
│ enable periods of the analog-to-digital conversion   │
│ circuit groups are not overlapped with each other    │
└─────────────────────────────────────┘
```

SIGNAL PROCESSING CIRCUIT, IN-MEMORY COMPUTING DEVICE AND CONTROL METHOD THEREOF

BACKGROUND

Artificial intelligence (AI) chips are one of the main research and development directions of the semiconductor industry. AI chips are chip structures that integrate memory, driving circuits, and computing circuits, and adopt in-memory computing (IMC) techniques to achieve real-time computing and decentralize the workload of the central processing unit. The application of AI chips is very wide, and AI chips are expected to have high efficiency, large amount of memory space, scalability, less power consumption, fast response time, smaller circuit size, reduced cost, and the like.

In addition to a memory array, AI chips adopting IMC also have a multi-channel digital-to-analog converter (DAC) and an analog-to-digital converter (ADC). However, when all ADCs are enabled at the same time, it is necessary to provide a sufficient reference voltage for all ADCs, thus causing noise and affecting the signal conversion results of the ADCs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 7 is a timing chart of the operation enable periods of an analog-to-digital conversion circuit group in some embodiments.

FIG. 8 is a flowchart of a control method of an in-memory computing device of an embodiment.

DETAILED DESCRIPTION

Figure 1:
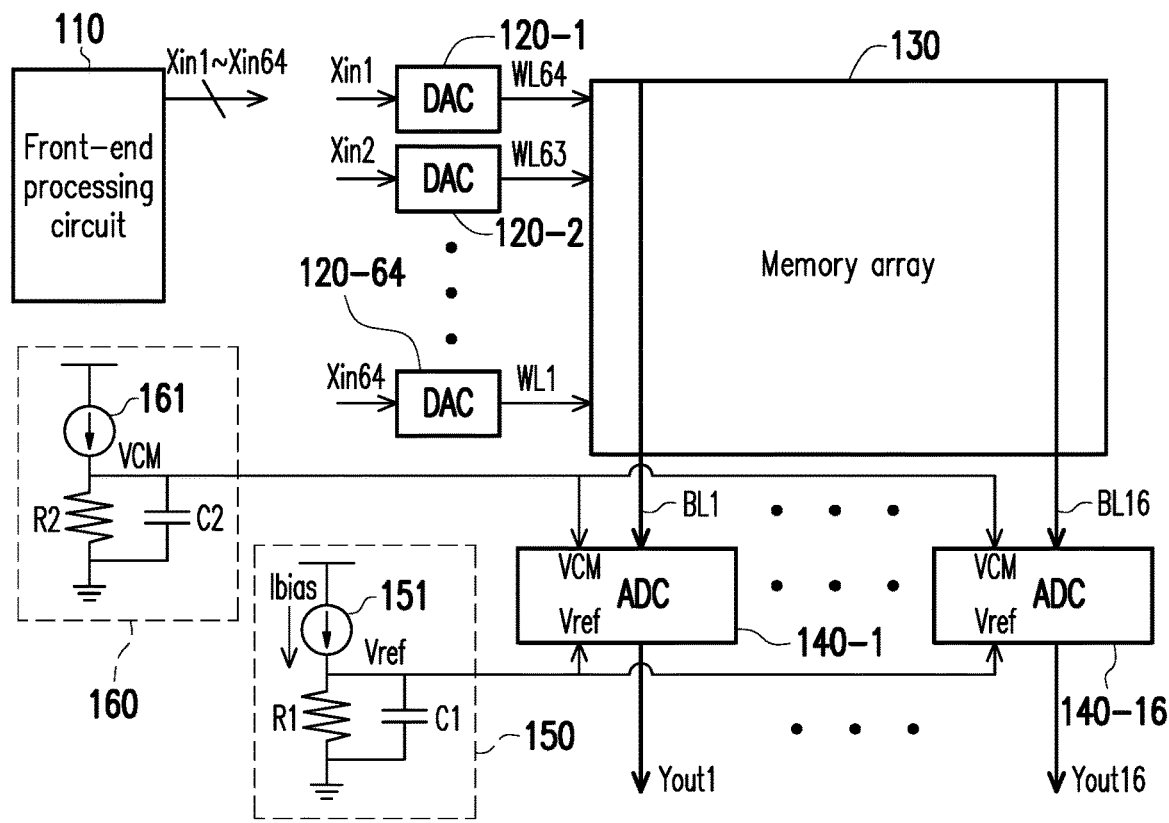
FIG. 1 is a functional block diagram of an in-memory computing (IMC) device according to an embodiment.

The following disclosure provides many different embodiments or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a functional block diagram of an in-memory computing (IMC) device 100 according to an embodiment. The in-memory computing device 100 may be used as an integrated circuit for an artificial intelligence (AI) chip or other applications. The AI chip may include a two-layer structure, one of which is a memory array and the other is a control circuit. In an embodiment, an AI chip is used as an example of the in-memory computing device 100.

The in-memory computing device 100 of FIG. 1 mainly includes a front-end processing circuit 110, a plurality of digital-to-analog conversion circuits 120-1 to 120-64, a memory array 130, and a plurality of analog-to-digital conversion circuits 140-1 to 140-16. Taking the AI integrated circuit applied to face recognition as an example of the in-memory computing device 100, the front-end processing circuit 110 may obtain images with human faces from an image sensor or other sources and capture corresponding facial features from the images to generate input digital signals used to represent the facial features. In the present embodiment, signals Xin1 to Xin64 are used as examples of the input digital signals. Those applying the present embodiment may adjust the number of bits of the input digital signals Xin1 to Xin64 according to needs. Those applying the present embodiment may also make the input digital signals represent different features or applications according to different AI integrated circuit applications.

The digital-to-analog conversion circuits 120-1 to 120-64 respectively receive a plurality of input digital signals Xin1 to Xin64 generated by the front-end processing circuit 110 to generate a plurality of input analog signals WL1 to WL64. The digital-to-analog conversion circuits 120-1 to 120-64 of the present embodiment may be 6-bit digital-to-analog converters (DACs).

The memory array 130 is coupled to the digital-to-analog conversion circuits 120-1 to 120-64. The memory array 130 receives the input analog signals WL1 to WL64 to generate a plurality of computed analog signals BL1 to BL16 using in-memory computation. The memory array 130 of the present embodiment may be a memory array formed by a floating-gate non-volatile semiconductor memory, a resistive random-access memory (ReRAM), a static random-access memory (SRAM), or other types of memory cells. The application of the present embodiment does not limit the memory cell type of the memory array 130.

The analog-to-digital conversion circuits 140-1 to 140-16, after receiving the corresponding computed analog signals BL1 to BL16, convert the computed analog signals BL1 to BL16 to output digital signals Yout1 to Yout16. The analog-to-digital conversion circuits 140-1 to 140-16 of the present embodiment may be 6-bit successive approximation analog-to-digital converters (ADCs). The application of the present embodiment adjusts the number of the digital-to-analog conversion circuits 120-1 to 120-64 and the analog-to-digital conversion circuits 140-1 to 140-16 and the number of conversion bits of each digital-to-analog conversion circuit and each analog-to-digital conversion circuit according to needs.

The in-memory computing device 100 further includes a first reference voltage generator 150 and a second reference voltage generator 160. The first reference voltage generator 150 is used to generate a first reference voltage Vref, and the second reference voltage generator 160 is used to generate a second reference voltage VCM. In detail, the first reference voltage generator 150 includes a resistor R1, a capacitor C1, and a current source 151. The current source 151 provides a current Ibias so that the output terminal of the first reference voltage generator 150 provides the reference voltage Vref. The capacitor C1 is used to maintain the voltage level of the reference voltage Vref. The second reference voltage generator 160 includes a resistor R2, a capacitor C2, and a current source 161. The current source 161 provides a current so that the output terminal of the second reference voltage generator 160 provides the reference voltage VCM. The capacitor C2 is used to maintain the voltage level of the reference voltage VCM.

If multi-channel analog-to-digital conversion circuits (for example, the analog-to-digital conversion circuits 140-1 to 140-16) are operated at the same time and convert the computed analog signals BL1 to BL16 to the output digital signals Yout1 to Yout16, a noise such as greater inrush current/surge current may be induced due to the need for full reference voltages Vref and VCM, thus causing the operation of the analog-to-digital conversion circuits to be affected by noise and not be accurate. In order to avoid noise, a larger capacitor may be additionally designed or a larger bias current may be used to eliminate the effect of inrush current/surge current so that the reference voltage of the analog-to-digital conversion circuits is more accurate. However, circuit area is increased and energy consumption is increased as a result.

Figure 2:
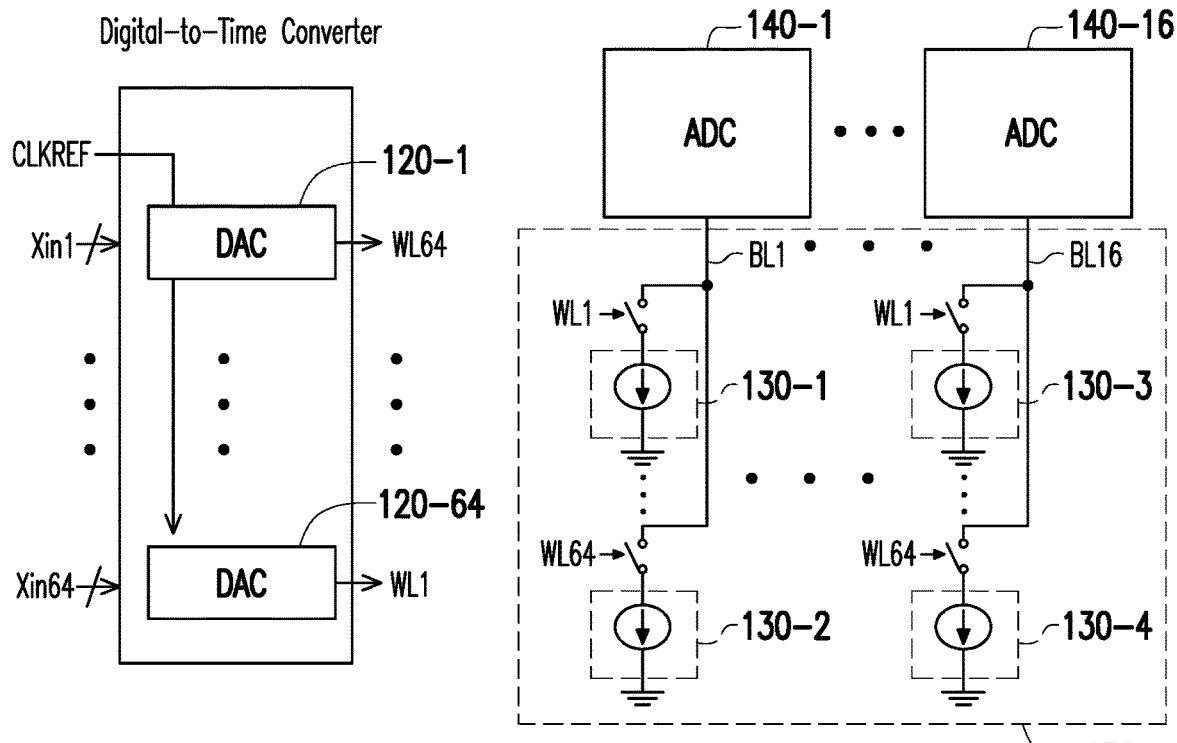
FIG. 2 is a circuit diagram of the in-memory computing device in FIG. 1.

FIG. 2 is a circuit diagram of the in-memory computing device 100 in FIG. 1. The digital-to-analog conversion circuits 120-1 to 120-64 in FIG. 2 are implemented by a digital-to-time converter. The digital-to-time converter uses a clock signal CLKREF to enable each of the digital-to-analog conversion circuits 120-1 to 120-64 at the same time to generate the input analog signals WL1 to WL64 according to the input digital signals Xin1 to Xin64. In the present embodiment, the memory array 130 includes a plurality of memory cells (here, memory cells 130-1 to 130-4 are exemplified), and each memory cell stores its own weighted value. When each of the memory cells 130-1 to 130-4 obtains one of the corresponding input analog signals WL1 to WL64, the memory cell uses the stored weight value and one of the corresponding input analog signals WL1 to WL64 for operation to generate the corresponding computed analog signals BL1 to BL16.

Figure 3A:
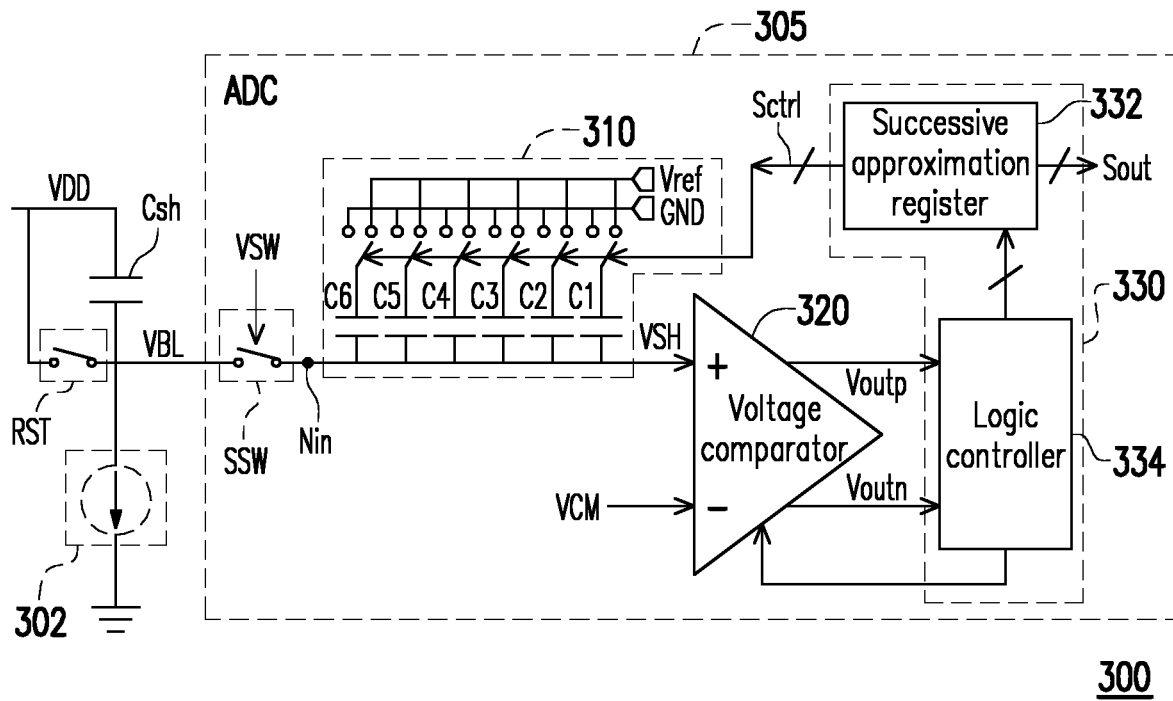
FIG. 3A is a circuit diagram of a signal processing circuit in an IMC device according to an embodiment.
Figure 3B:
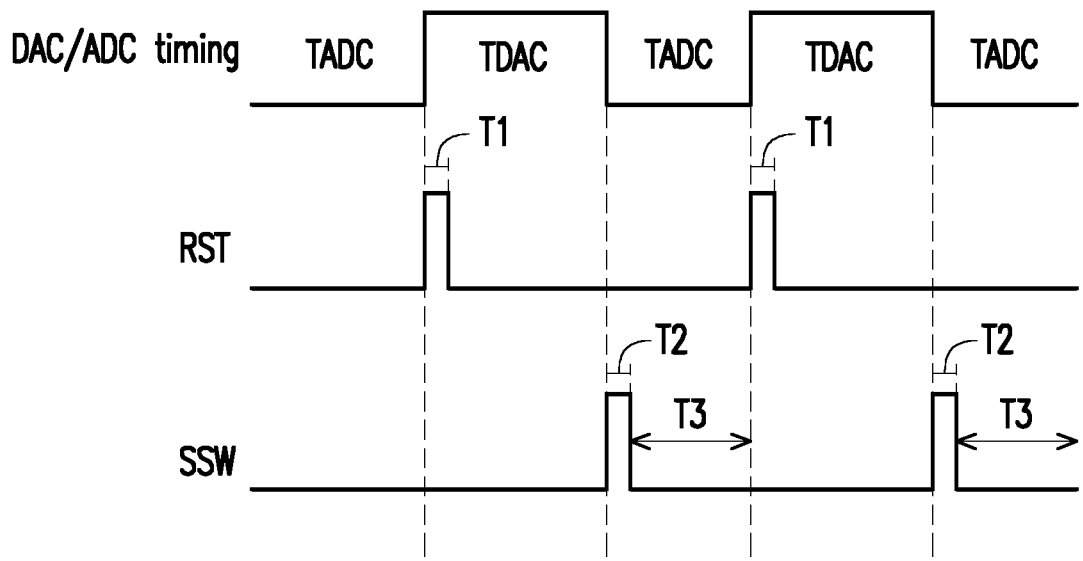
FIG. 3B is a timing chart of a reset switch and a sampling switch during the operation enable period of a digital-to-analog conversion circuit and an analog-to-digital conversion circuit corresponding to the embodiment of FIG. 3A.

FIG. 3A is a circuit diagram of a signal processing circuit 300 in the IMC device 100 according to an embodiment, and FIG. 3B is a timing chart of a reset switch RST and a sampling switch SSW during the operation enable period of the digital-to-analog conversion circuits 120-1 to 120-64 and the analog-to-digital conversion circuits 140-1 to 140-16 corresponding to the embodiment of FIG. 3A. The signal processing circuit 300 of FIG. 3A is an example of the analog-to-digital conversion circuits 140-1 to 140-16 in FIG. 1. Referring to FIG. 3A, the signal processing circuit 300 mainly includes the reset switch RST, a capacitor Csh, a sampling switch SSW, a capacitor array circuit 310, a voltage comparator 320, and a successive approximation circuit 330. In the present embodiment, the sampling switch SSW, the capacitor array circuit 310, the voltage comparator 320, and the successive approximation circuit 330 are referred to as a successive approximation (SAR) ADC 305. The function and operation of each element of the signal processing circuit 300 are detailed below.

One terminal of the reset switch RST is coupled to a system voltage terminal VDD, and the other terminal of the reset switch RST is coupled to a memory cell 302 to receive an input voltage signal VBL. The two terminals of the capacitor Csh are respectively coupled to the system voltage terminal VDD and the other end of the reset switch RST. One terminal of the sampling switch SSW receives the input voltage signal VBL, and the other terminal of the sampling switch SSW is coupled to an input terminal Nin of the capacitor array circuit 310. The control terminal of the sampling switch SSW receives the signal VSW. The input voltage signal VBL is generated by one of a plurality of memory cells (e.g., the memory cell 302) in the memory array 130.

The capacitor array circuit 310 includes a plurality of capacitors C1 to C6 and a plurality of corresponding capacitive switches. The two reference voltage terminals of the capacitor array circuit 31 respectively receive the first reference voltage terminal Vref and a ground voltage GND. A first terminal of each of the capacitors C1 to C6 is coupled to the input terminal Nin of the capacitor array circuit 310. The input terminal of each capacitive switch is respectively coupled to the second terminal of each of the corresponding capacitors C1 to C6. The first output terminal of each capacitive switch receives the first reference voltage Vref from the second reference voltage generator 160 in FIG. 1. The second output terminal of each capacitive switch receives a third reference voltage (e.g., the ground voltage GND), and the control terminal of each capacitive switch is respectively coupled to a corresponding successive approximation control signal Sctrl. The successive approximation control signal Sctrl of the present embodiment is a 6-bit signal, and each bit signal in the successive approximation control signal Sctrl is respectively coupled to the control terminal of the capacitive switch corresponding to each of the capacitors C1 to C6. The capacitor array circuit 310 adjusts the input voltage signal VBL according to the successive approximation control signal Sctrl to generate an adjusted voltage VSH.

The first receiving terminal of the voltage comparator 320 receives the adjusted voltage VSH. The second receiving terminal of the voltage comparator 320 receives the second reference voltage VCM from the second reference voltage generator 160 in FIG. 1. The voltage comparator 320 compares the voltage levels of the adjusted voltage VSH and the second reference voltage VCM to generate comparison signals (e.g., comparison signals Voutp and Voutn).

The successive approximation circuit 330 is coupled to the voltage comparator 320 and the capacitor array circuit 310. The successive approximation circuit 330 generates the successive approximation control signal Sctrl according to the comparison signals and generates an output digital signal Sout corresponding to the input voltage signal VBL. In detail, the successive approximation circuit 330 includes a successive approximation register 332 and a logic controller 334. The successive approximation register 332 is used to temporarily store a digital code. The logic controller 334 is coupled to the successive approximation register 332. The logic controller 334 counts a count value, adjusts the digital code according to the count value and the comparison signals Voutp and Voutn, and generates the successive approximation control signal Sctrl according to the digital code.

The DAC/ADC timing in FIG. 3B is used to represent the operation enable periods of the digital-to-analog conversion circuits 120-1 to 120-64 and the analog-to-digital conversion circuits 140-1 to 140-16 in FIG. 1. A timing TADC indicates that during the operation enable periods of the analog-to-digital conversion circuits 140-1 to 140-16, the analog-to-digital conversion circuits 140-1 to 140-16 perform signal conversion in the timing TADC. A timing TDAC indicates that during the operation enable periods of the digital-to-analog conversion circuits 120-1 to 120-64, the digital-to-analog conversion circuits 120-1 to 120-64 perform signal conversion in the timing TDAC. A conduction time T1 of the reset switch RST is located at the previous stage of the timing TDAC, so that the input voltage signal VBL is equal to a system voltage of the system voltage terminal VDD. The reset switch RST is cut off at a non-conduction time outside the conduction time T1. A conduction time T2 of the sampling switch SSW is located at the previous stage of the timing TADC, so that the input voltage signal VBL generated via the memory cell 302 is transmitted to the input terminal Nin of the capacitor array circuit 310. The sampling switch SSW is cut off at a non-conduction time outside the conduction time T2 by the signal VSW. The capacitor Csh is used to maintain the voltage level of the input voltage signal VBL during the non-conduction time (i.e., the non-reset stage of the analog-to-digital conversion circuit) of the reset switch RST outside the conduction time T1.

The operation of the successive approximation circuit 330 is explained in detail herein. Please refer to FIG. 3A and FIG. 3B at the same time. During the reset stage of the signal processing circuit 300, that is, during the conduction time T2 of the sampling switch SSW, the logic controller 334 resets to make the count value an initial value (for example, "1"), and the logic controller 334 sets the digital code in the successive approximation register 332 to half the resolution of the signal processing circuit 300. For example, when the signal processing circuit 300 uses a 6-bit ADC as an example, the maximum value of the count value (i.e., the conversion bit value) is 6, and the converter resolution is 2 to the 5th power (i.e., "32"), so the digital code is set to 2 to the 4th power (i.e., "16"). Then, the digital code ("16" at this time) is converted into a binary value as the successive approximation control signal Sctrl. At this time, the adjusted voltage VSH is adjusted to a voltage value of a specific multiple of the input voltage signal VBL, and the voltage comparator 320 generates the comparison signals Voutp and Voutn according to the adjusted voltage VSH and the second reference voltage VCM.

When the logic controller 334 increases the count value by one (for example, "2") during the operation enable stage of the signal processing circuit 300, that is, at a time T3 of the sampling switch SSW, the logic controller 334 determines how to adjust the digital code in the successive approximation register 332 according to the comparison signals Voutp and Voutn. For example, when the adjusted voltage VSH is higher than the reference voltage VCM, the voltage value of the input voltage signal VBL is high, and the digital code is added by 2 to the Nth power, wherein N is the conversion bit value (i.e., "6") minus the current count value (i.e., "2"); when the adjusted voltage VSH is lower than the reference voltage VCM, the voltage value of the input voltage signal VBL is lower, and the digital code is subtracted by 2 to the Nth power, wherein N is the conversion bit value (i.e., "6") minus the current count value (i.e., "2"). Then, the logic controller 334 increases the count value by 1 (for example, changing from "2" to "3"), and the above action is repeated.

When the count value in the logic controller 334 reaches the conversion bit value (e.g., "6") and the above operation is completed, the logic controller 334 uses the adjusted digital code as the output digital signal Sout of the signal processing circuit 300 to complete signal conversion. It should be noted that the signal conversion in the successive approximation circuit 330 may also be implemented in various other ways, and the present embodiment provides one of them as an example.

In the embodiment of FIG. 3A and FIG. 3B, the signal processing circuit 300 still needs the switch RST, the capacitor Csh, and the sampling switch SSW in order for the SAR ADC 305 to operate smoothly, and therefore elements may not be omitted to reduce chip area. In addition, if the multi-channel analog-to-digital conversion circuits (the analog-to-digital conversion circuits 140-1 to 140-16) in FIG. 1 are operated at the same time, the reference power generators 150 and 160 may induce noise such as greater inrush current/surge current so that the operation of the analog-to-digital conversion circuits is affected by noise and inaccurate. Therefore, an embodiment provides an improved signal processing circuit to omit some elements, or drives the multi-channel analog-to-digital conversion circuits in groups to reduce the load of the reference power generator.

Figure 4A:
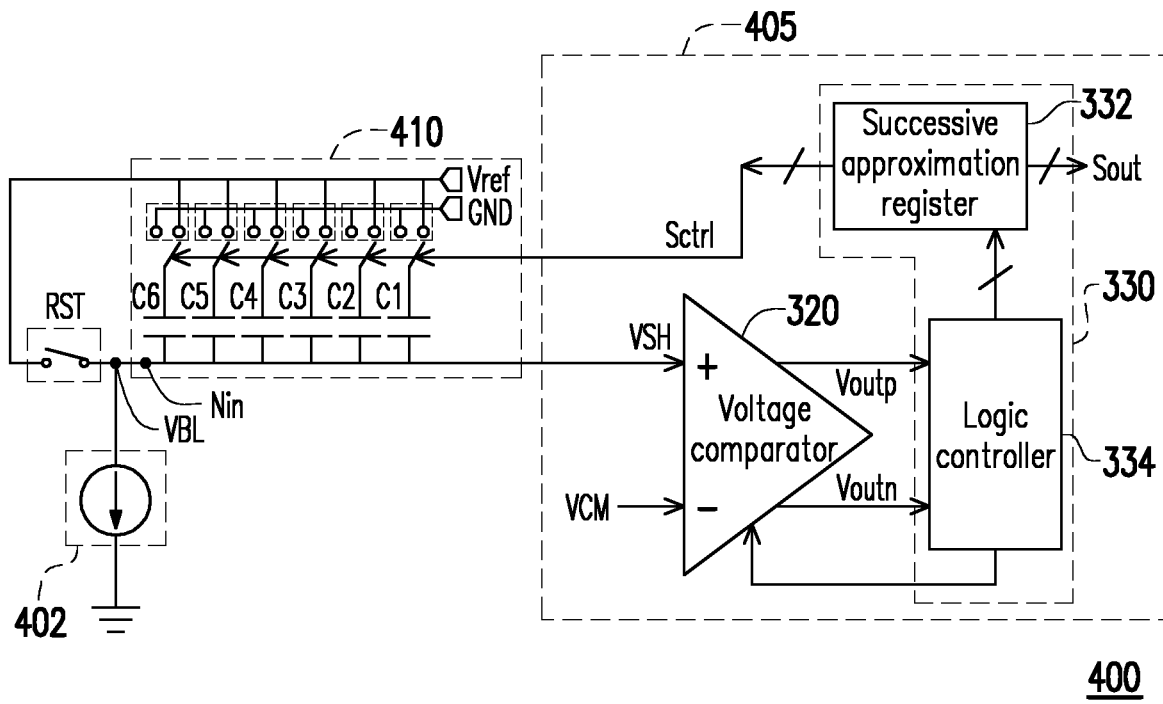
FIG. 4A is a circuit diagram of a signal processing circuit in an IMC device according to the first embodiment.
Figure 4B:
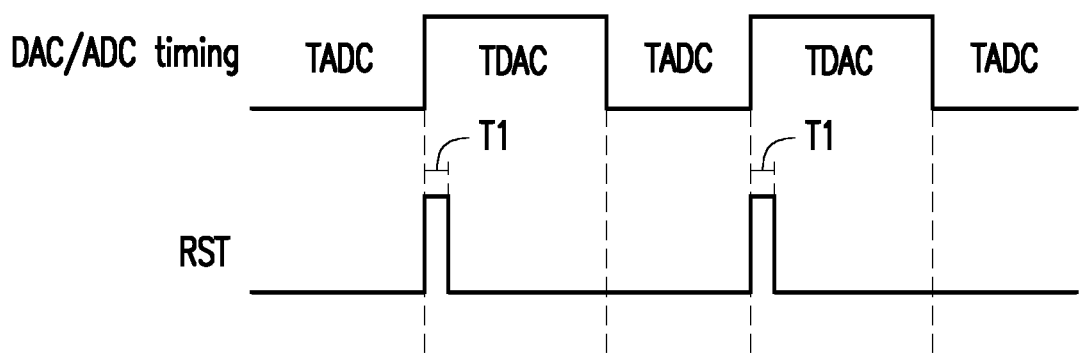
FIG. 4B is an operation enable period of the digital-to-analog conversion circuits and the analog-to-digital conversion circuits and a timing chart of the reset switch in the first embodiment.

FIG. 4A is a circuit diagram of a signal processing circuit 400 in the IMC device 100 according to the first embodiment, and FIG. 4B is an operation enable period of the digital-to-analog conversion circuits 120-1 to 120-64 and the analog-to-digital conversion circuit 140-1 to 140-16 and a timing chart of the reset switch RST in the first embodiment. The signal processing circuit 400 of FIG. 4A is an example of the analog-to-digital conversion circuits 140-1 to 140-16 in FIG. 1. A capacitor array circuit 410, the voltage comparator 320, and the successive approximation circuit 330 in FIG. 4A are all the same as the corresponding elements in FIG. 3A.

The main difference between the signal processing circuit 400 in FIG. 4A and the signal processing circuit 300 in FIG. 3A is that the capacitor array circuit 410 is moved from the SAR ADC 305 in FIG. 3A to the position of the capacitor Csh in FIG. 3A, and the sampling switch SSW in FIG. 3A is omitted. That is, the capacitor array circuit 410 of FIG. 4A replaces the function of the capacitor Csh, and is used to maintain the voltage level of the input voltage signal VBL during the non-conduction time of the reset switch RST outside the conduction time T1 (i.e., the non-reset stage of the analog-to-digital conversion circuits). That is, in the present embodiment, the capacitor array circuit 410 is moved outside an SAR ADC 405, so that the sampling circuit SSW and the capacitor Csh in FIG. 3A are removed. In the present embodiment, the sum of the capacitance values of capacitors C1' to C6' in the capacitor array circuit 410 is increased until the capacitor array circuit 410 may replace the function of the capacitor Csh.

Moreover, in FIG. 4A, a first terminal of the reset switch RST receives the first reference voltage Vref, and a second terminal of the reset switch RST receives the input voltage signal VBL. The input terminal Nin of the capacitor array circuit 410 is directly coupled to a memory cell 402 to receive the input voltage signal VBL without receiving the input voltage signal VBL via the sampling switch SSW of FIG. 3A. The input voltage signal VBL is generated by one of a plurality of memory cells (e.g., the memory cell 402) in the memory array 130.

The DAC/ADC timing in FIG. 4B is used to indicate the operation enable periods of the digital-to-analog conversion circuits 120-1 to 120-64 and the analog-to-digital conversion circuits 140-1 to 140-16 in FIG. 1. The timings TADC and TDAC in FIG. 3B and FIG. 3B represent the same function. As may be seen from FIG. 4A and FIG. 4B, although the sampling switch SSW is omitted in the signal processing circuit 400 of FIG. 4A, the analog-to-digital conversion circuits 140-1 to 140-16 in FIG. 1 may still be operated at the same time in the timing TADC without modifying the DAC/ADC timing and the timing of the reset switch RST. Therefore, compared with FIG. 3A, the signal processing circuit 400 in FIG. 4A does not have the capacitor Csh and the sampling switch SSW to reduce the number of elements.

Figure 5A:
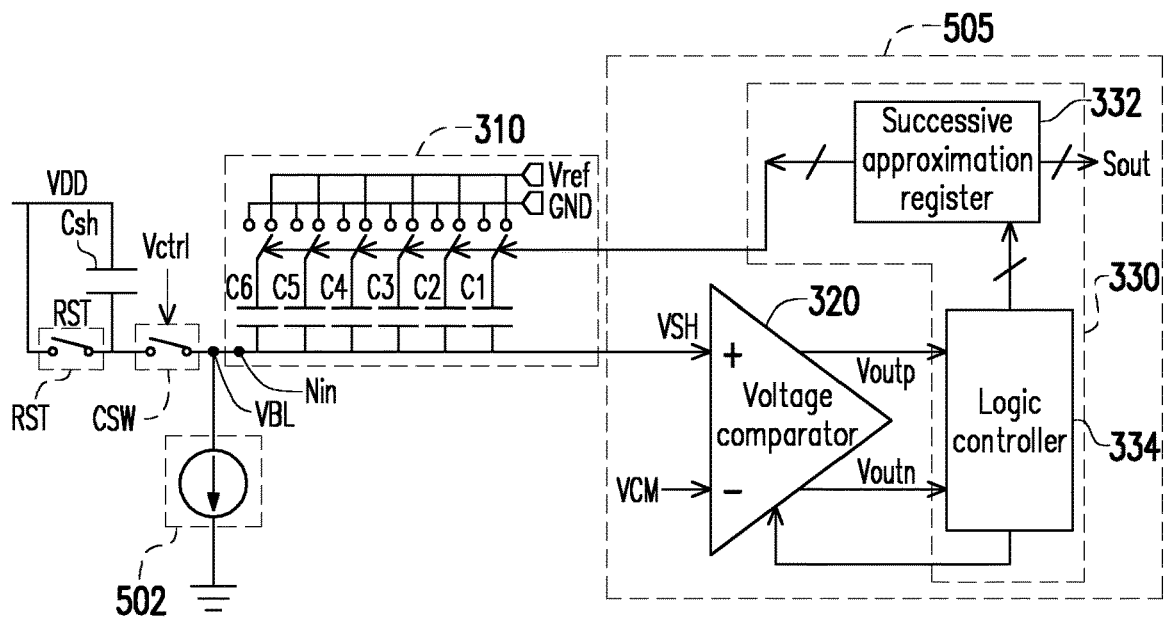
FIG. 5A is a circuit diagram of a signal processing circuit in an IMC device according to the second embodiment.

FIG. 5A is a circuit diagram of a signal processing circuit 500 in the IMC device 100 according to the second embodiment. The signal processing circuit 500 of FIG. 5A is an example of the analog-to-digital conversion circuits 140-1 to 140-16 in FIG. 1. A capacitor array circuit 310, the voltage comparator 320, and the successive approximation circuit 330 in FIG. 5A are all the same as the corresponding elements in FIG. 3A.

The main difference between the signal processing circuit 500 in FIG. 5A and the signal processing circuit 300 in FIG. 3A is that the capacitor array circuit 510 and a control switch CSW are moved from the SAR ADC 305 of FIG. 3A to an external circuit, and the timing of the control switch CSW is different from that of the sampling switch SSW in FIG. 3B. In other words, the SAR ADC 505 of FIG. 5A includes the voltage comparator 320 and the successive approximation circuit 330, and may not include the control switch CSW and the capacitor array circuit 310. The control switch CSW is controlled by a shunt capacitance control signal Vctrl. A first terminal of the control switch CSW is coupled to the first terminal of the first capacitor Csh and the second terminal of the reset switch RST. The second terminal of the control switch CSW receives the input voltage signal VBL. The input voltage signal VBL is generated by one of a plurality of memory cells (e.g., a memory cell 502) in the memory array.

Figure 5B:
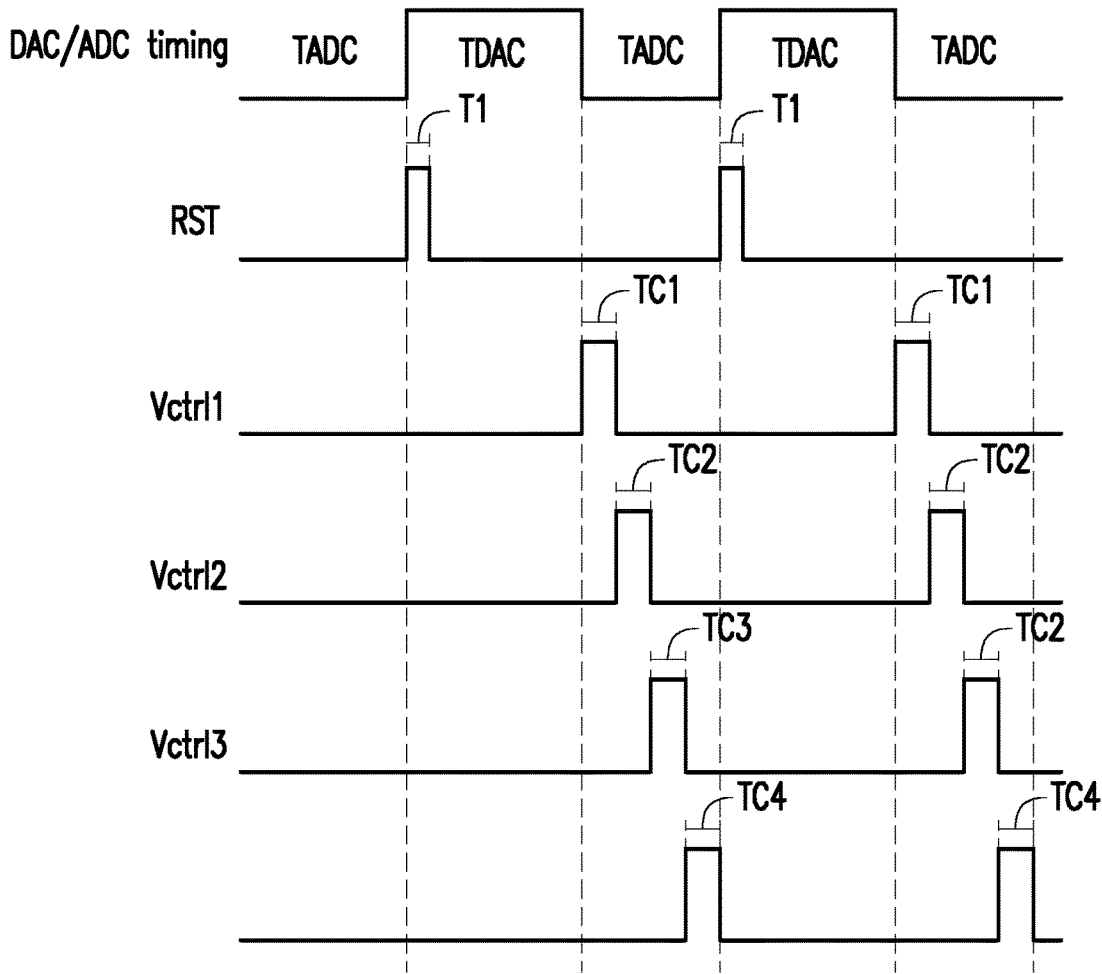
FIG. 5B is a timing chart of a reset switch and a shunt capacitor control signal during the operation enable periods of a digital-to-analog conversion circuit and an analog-to-digital conversion circuit in the second embodiment.

FIG. 5B is a timing chart of the reset switch RST and the shunt capacitor control signal Vctrl of the signal processing circuit 500 in FIG. 5A in the second embodiment. Please refer to FIG. 5A and FIG. 5B at the same time. The reset switch RST is enabled at the start period of the timing TDAC. The shunt capacitor control signal Vctrl and the corresponding switch CSW are enabled during the timing TDAC for providing the input voltage signal VBL to the capacitor array circuit 310 and SAR ADC 505. In the timing TADC, the reset switch RST, the shunt capacitor control signal Vctrl, and the corresponding switch CSW are disabled. The SAR ADC 505 of FIG. 5A is operated in the timing TADC and is described in FIG. 6.

Figure 6:
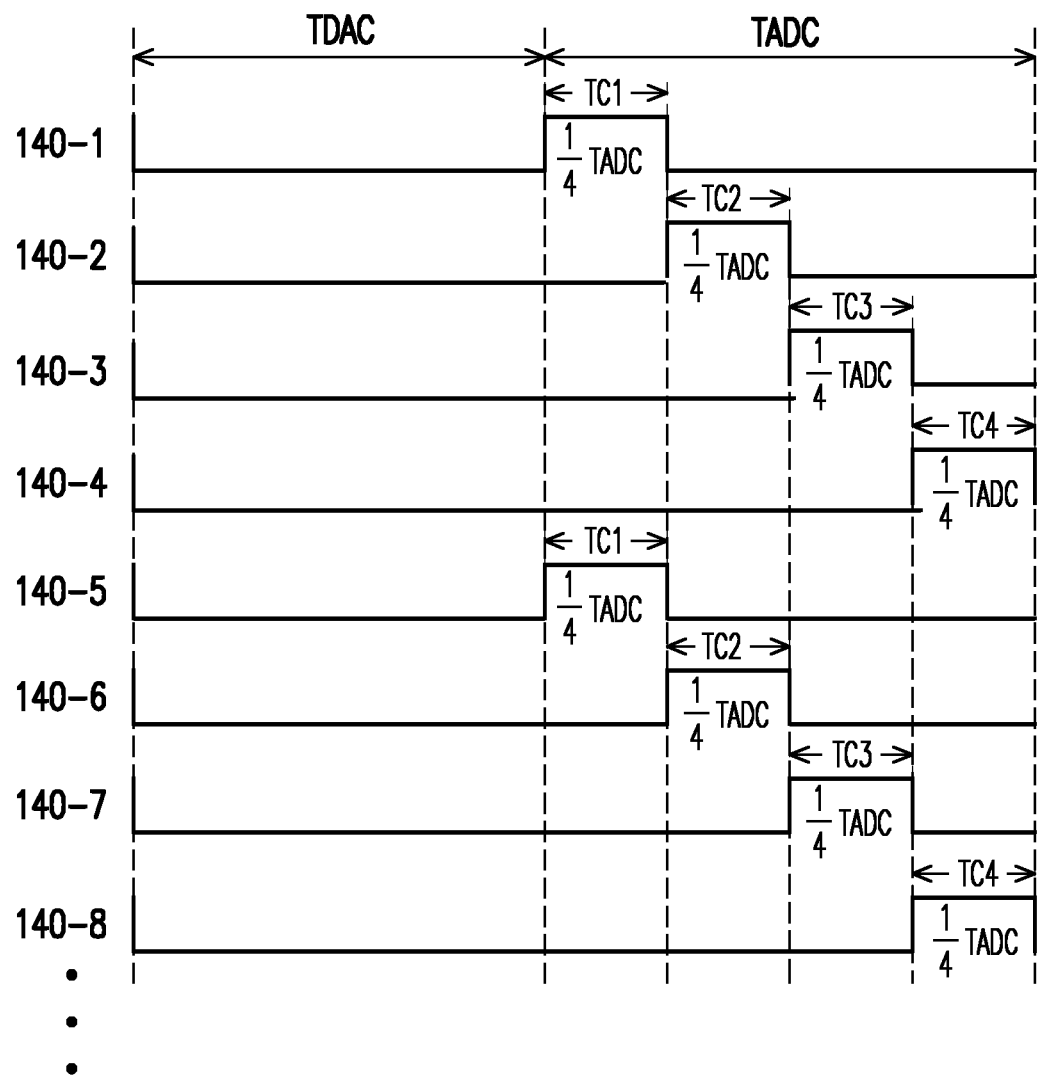
FIG. 6 is a timing chart of a portion of an analog-to-digital conversion circuit during an operation enable period in the second embodiment.

FIG. 6 is a timing chart of a portion of the analog-to-digital conversion circuits 140-1 to 140-8 during an operation enable period in the second embodiment. FIG. 6 takes the analog-to-digital conversion circuits 140-1 to 140-8 as the example, please refer to FIG. 1 and FIG. 6. The second embodiment divides the analog-to-digital conversion circuits 140-1 to 140-16 into a plurality of analog-to-digital conversion circuit groups. Each analog-to-digital conversion circuit group includes at least two analog-to-digital conversion circuits. For example, in the second embodiment, the analog-to-digital conversion circuits 140-1, 140-5, 140-9, and 140-13 are divided into a first group of analog-to-digital conversion circuits; the analog-to-digital conversion circuits 140-2, 140-6, 140-10, and 140-14 are divided into a second group of analog-to-digital conversion circuits; the analog-to-digital conversion circuits 140-3, 140-7, 140-11, and 140-15 are divided into a third group of analog-to-digital conversion circuits; and the analog-to-digital conversion circuits 140-4, 140-8, 140-12, and 140-16 are divided into a fourth group of analog-to-digital conversion circuits. Therefore, the in-memory computing device 100 in FIG. 1 includes four analog-to-digital conversion circuit groups, and each analog-to-digital conversion circuit group includes four analog-to-digital conversion circuits. Those applying the present embodiment may adjust the number of analog-to-digital conversion circuits in each analog-to-digital conversion circuit group according to needs. For example, each analog-to-digital conversion circuit group includes 2, 3, 4, or 6 analog-to-digital conversion circuits.

In the second embodiment, signals of the analog-to-digital conversion circuits 140-1~140-8 in FIG. 6 are respectively used to control operation enable periods TC1 to TC4 of the four analog-to-digital conversion circuit groups. As shown in FIG. 6, the operation enable period (the timing TDAC) of the digital-to-analog conversion circuits 120-1 to 120-64 and the operation enable period (the timing TADC) of the analog-to-digital conversion circuits 140-1 to 140-64 are staggered with each other and are not overlapped with each other. In addition, during the operation enable period (a timing TADC) of the analog-to-digital conversion circuits, the corresponding enable periods TC1 to TC4 of the four analog-to-digital conversion circuit groups are also not overlapped with each other. Signals of the analog-to-digital conversion circuits 140-1~140-8 in FIG. 6 is for enabling SAR ADC 505 in each analog-to-digital conversion circuits 140-1~140-8 in FIG. 5A, respectively. In this way, during one of the corresponding enable periods of the timing TADC (here, the corresponding enable period TC1 is taken as an example), the analog-to-digital conversion circuits 140-1, 140-5, 140-9, and 140-13 in the first analog-to-digital conversion circuit group convert a portion of the computed analog signals (e.g., the computed analog signals BL1, BL5, BL9, and BL13) in FIG. 1 to a portion of the output digital signals (e.g., the output digital signals Yout1, Yout5, Yout9, and Yout13) during the corresponding enable period TC1, and so on, until all the computed analog signals BL1 to BL16 are converted to the output digital signals Yout1 to Yout16 via the analog-to-digital conversion circuits 140-1 to 140-16 to complete the particular signal conversion. Moreover, the digital-to-analog conversion circuits 120-1 to 120-64 in FIG. 1 perform signal conversion at the same time during the operation enable period (the timing TDAC).

Since in the second embodiment, the analog-to-digital conversion circuits 140-1 to 140-16 are driven in a time-sharing manner in groups, each time point of the first reference voltage generator 150 and the second reference voltage generator 160 in FIG. 1 during the operation enable period (the timing TDAC) of the analog-to-digital conversion circuits 140-1 to 140-16 only needs to provide the first reference voltage Vref and the second reference voltage VCM to one of the analog-to-digital conversion circuit groups, and the first reference voltage Vref and the second reference voltage VCM do not need to be provided to all of the analog-to-digital conversion circuits 140-1 to 140-16. In the second embodiment, the analog-to-digital conversion circuits 140-1 to 140-16 are driven in a time-sharing manner in groups to reduce the inrush current/surge current generated at the reference voltage processor in the analog-to-digital conversion circuits 140-1 to 140-16 to avoid reduction in the signal distortion of the analog signal due to the charge sharing effect of the capacitor. That is to say, in the second embodiment, the current source 151 in the first reference voltage generator 150 of FIG. 1 only needs to provide 4 of the bias current Ibias to correspondingly drive one of the analog-to-digital conversion circuit groups, and it is not necessary to provide 16 of the bias current Ibias to drive all of the analog-to-digital conversion circuits 140-1 to 140-16. In addition, the capacitance value of the capacitor C1 may also be reduced proportionally, for example, the original capacitance value is reduced to a value obtained by dividing the original capacitance value by 4. Because the capacitance values of the capacitors C1 and C2 in the reference voltage generators 150 and 1260 are reduced, the area of the circuit layout may also be reduced.

The analog-to-digital conversion circuits 140-1 and 140-5 are distinguished in the same group of analog-to-digital conversion circuits, so the analog-to-digital conversion circuits 140-1 and 140-5 perform signal conversion at the same time during the operation enable period TC1; the analog-to-digital conversion circuits 140-2 and 140-6 are distinguished in the same group of analog-to-digital conversion circuits, so the analog-to-digital conversion circuits 140-2 and 140-6 perform signal conversion at the same time during the operation enable period TC2; the analog-to-digital conversion circuits 140-3 and 140-7 are distinguished in the same group of analog-to-digital conversion circuits, so the analog-to-digital conversion circuits 140-3 and 140-7 perform signal conversion at the same time during the operation enable period TC3; the analog-to-digital conversion circuits 140-4 and 140-8 are distinguished in the same group of analog-to-digital conversion circuits, so the analog-to-digital conversion circuits 140-4 and 140-8 perform signal conversion at the same time during the operation enable period TC4. The time lengths of the operation enable periods T1 to T4 of the present embodiment are all less than or equal to ¼ of the timing TADC.

In the present embodiment, the time length of the timing TADC depends on the worst case when circuit simulation is performed, and element deviation in different semiconductor processes needs to be considered. Therefore, those applying the present embodiment may set the timing TADC using a fixed value via the data from the circuit simulation when designing the timing TADC. In some embodiments, since the grouped analog-to-digital conversion circuit groups are enabled one by one for signal processing, in some embodiments, the analog-to-digital conversion circuit group at the previous stage may also be designed to generate an end signal to the analog-to-digital conversion circuit group at the later stage after signal processing is completed, so that the analog-to-digital conversion circuit group at the later stage is successively enabled and performs signal processing. Therefore, the overall operation time of the timing TADC may be reduced.

FIG. 7 is a timing chart of the operation enable period of an analog-to-digital conversion circuit group in some embodiments. The timing TDAC in FIG. 7 represents the operation enable period of the digital-to-analog conversion circuits 120-1 to 120-64 in FIG. 1, that is, the digital-to-analog conversion circuits 120-1 to 120-64 in FIG. 1 perform signal conversion at the same time during the operation enable period (the timing TDAC). A timing TADC' in FIG. 7 represents the operation enable period of the analog-to-digital conversion circuits 140-1 to 140-16 in FIG. 1, and there are 4 analog-to-digital conversion circuit groups ADC #1, ADC #2, ADC #3, and ADC #4. In the present embodiment, all the analog-to-digital conversion circuits (e.g., 140-1, 140-5, 140-9, and 140-13) in one of the analog-to-digital conversion circuit groups at the previous stage (e.g., the first analog-to-digital conversion circuit group ADC #1) generate an end signal END after a corresponding enable period TC1' to complete signal conversion and transmit an end signal END1 to another one of the analog-to-digital conversion circuit groups at the later stage (such as the second analog-to-digital conversion circuit group ADC #2). After the other one of the analog-to-digital conversion circuit groups at the later stage (for example, the second analog-to-digital conversion circuit group ADC #2) receives the end signal END1 transmitted by one of the analog-to-digital conversion circuit groups at the previous stage (for example, the first analog-to-digital conversion circuit group ADC #1), it enters a corresponding enable period TC2' for signal conversion, and so on, until all the analog-to-digital conversion circuit groups ADC #1, ADC #2, ADC #3, and ADC #4 have completed signal conversion. As a result, since each corresponding enable period TC1' to TC4' is shorter than the worst case when circuit simulation is performed (e.g., TC1 to TC4 in FIG. 6), the timing TADC' of FIG. 7 is slightly shorter than the timing TADC set with the fixed value in FIG. 6 to accelerate the operation cycle time of all analog-to-digital conversion circuits.

FIG. 8 is a flowchart of a control method 800 of an in-memory computing device of an embodiment. The in-memory computing device of FIG. 8 is, for example, the in-memory computing device 100 of FIG. 1, and the in-memory computing device includes a memory array and a plurality of analog-to-digital conversion circuits. Referring to FIG. 1 and FIG. 8, a control method 810 mainly includes steps S810 and S820. In step S810, the analog-to-digital conversion circuits 140-1 to 140-16 are divided into a plurality of analog-to-digital conversion circuit groups, and each analog-to-digital conversion circuit group includes at least two analog-to-digital conversion circuits. In step S820, the analog-to-digital conversion circuits 140-1 to 140-16 are controlled so that during the operation enable periods of the analog-to-digital conversion circuits, the corresponding enable periods of the analog-to-digital conversion circuit groups are not overlapped with each other. The steps of controlling the analog-to-digital conversion circuits 140-1 to 140-16 further include: generating an end signal via one of the analog-to-digital conversion circuit groups of the previous stage after signal conversion is completed, and controlling another one of the analog-to-digital conversion circuit groups at the later stage to enter the corresponding enable period after receiving the end signal transmitted by one of the analog-to-digital conversion circuit groups of the previous stage to successively perform signal conversion. For related implementations of the control method 800, please refer to the above embodiments.

Based on the above, in an embodiment, the capacitor array circuit in the SAR ADC may be used to replace the function of the capacitor Csh, and the sampling switch SSW is removed, thereby reducing the number of elements. In addition, in an embodiment, the analog-to-digital conversion circuits are driven in a time-sharing manner in groups to reduce the inrush current/surge current generated at the reference voltage processor to avoid reduction in the signal distortion of the analog signals due to the charge sharing effect of the capacitor.

According to some embodiments, a signal processing circuit is provided. The signal processing circuit includes: a plurality of analog-to-digital conversion circuits, wherein each of the analog-to-digital conversion circuits includes: a reset switch, wherein a first terminal thereof receives a first reference voltage, and a second terminal of the reset switch receives an input voltage signal; a capacitor array circuit, wherein a reference voltage terminal thereof receives the first reference voltage, an input terminal of the capacitor array circuit receives the input voltage signal, and the capacitor array circuit adjusts the input voltage signal according to a successive approximation control signal to generate an adjusted voltage; a voltage comparator, wherein a first receiving terminal thereof receives the adjusted voltage, a second receiving terminal of the voltage comparator receives a second reference voltage, and the voltage comparator compares voltage levels of the adjusted voltage and the second reference voltage to generate a comparison signal; and a successive approximation circuit coupled to the voltage comparator and the capacitor array circuit, wherein the successive approximation circuit generates the successive approximation control signal according to the comparison signal and generates an output digital signal corresponding to the input voltage signal, wherein the capacitor array circuit maintains the input voltage signal in a non-reset stage. According to some embodiments, the signal processing circuit is applied to an in-memory computing device, and the in-memory computing device further includes: a memory array including a plurality of memory cells, wherein the analog-to-digital conversion circuit is coupled to one of the memory cells in the memory array, and the input voltage signal is generated by one of the plurality of memory cells in the memory array. According to some embodiments, the successive approximation circuit includes: a successive approximation register for temporarily storing a digital code; and a logic controller coupled to the successive approximation register, wherein the logic controller counts a count value, adjusts the digital code according to the count value and the comparison signal, and generates the successive approximation control signal according to the digital code, and when the count value reaches a conversion bit value, the logic controller uses an adjusted digital code as the output digital signal of the signal processing circuit. According to some embodiments, the capacitor array circuit includes: a plurality of capacitors, wherein a first terminal of each of the capacitors is coupled to the input terminal of the capacitor array circuit; and a plurality of capacitive switches, wherein an input terminal of each of the capacitive switches is respectively coupled to a second terminal of each of the corresponding capacitors, a first output terminal of each of the capacitive switches receives the first reference voltage, a second output terminal of each of the capacitive switches receives a third reference voltage, and a control terminal of each of the capacitive switches is respectively coupled to the corresponding successive approximation control signal.

According to some embodiments, an in-memory computing device is provided. The in-memory computing device includes: a plurality of digital-to-analog conversion circuits respectively receiving a plurality of input digital signals to generate a plurality of input analog signals; a memory array coupled to the digital-to-analog conversion circuits, wherein the memory array receives the input analog signals to generate a plurality of computed analog signals using an in-memory computation; and a plurality of analog-to-digital conversion circuits coupled to the memory array, wherein the analog-to-digital conversion circuits are divided into a plurality of analog-to-digital conversion circuit groups, each of the analog-to-digital conversion circuit groups includes at least two of the analog-to-digital conversion circuits, and during an operation enable period of the analog-to-digital conversion circuits, corresponding enable periods of the analog-to-digital conversion circuit groups are not overlapped with each other, and the analog-to-digital conversion circuits in the analog-to-digital conversion circuit groups convert a portion of the computed analog signals to a portion of an output digital signal during the corresponding enable periods. According to some embodiments, one of the analog-to-digital conversion circuit groups at a previous stage generates an end signal after a signal conversion is completed and transmits the end signal to another of the analog-to-digital conversion circuit groups at a later stage. According to some embodiments, the other one of the analog-to-digital conversion circuit groups at the later stage enters the corresponding enable period to perform the signal conversion after receiving the end signal transmitted by one of the analog-to-digital conversion circuit groups at the previous stage. According to some embodiments, the in-memory computing device further includes: a first reference voltage generator coupled to the analog-to-digital conversion circuits, wherein the reference voltage generator provides a first reference voltage to one of the analog-to-digital conversion circuit groups at each time point during the operation enable period. According to some embodiments, the in-memory computing device further includes: a second reference voltage generator coupled to the analog-to-digital conversion circuits, wherein the reference voltage generator provides a second reference voltage to one of the analog-to-digital conversion circuit groups at each time point during the operation enable period. According to some embodiments, an operation enable period of the digital-to-analog conversion circuits and the operation enable period of the analog-to-digital conversion circuits are staggered with each other and are not overlapped with each other. According to some embodiments, the digital-to-analog conversion circuits perform a signal conversion at the same time during an operation enable period. According to some embodiments, each of the analog-to-digital conversion circuits includes: a reset switch, wherein a first terminal thereof is coupled to a system voltage terminal; a first capacitor, wherein a first terminal thereof is coupled to a second terminal of the reset switch, and a second terminal of the first capacitor is coupled to the system voltage terminal; a control switch, wherein a first terminal thereof is coupled to the first terminal of the first capacitor and the second terminal of the reset switch, and a second terminal of the control switch receives an input voltage signal, wherein the input voltage signal is generated by one of a plurality of memory cells in the memory array; a capacitor array circuit, wherein a power supply terminal thereof receives a first reference voltage, an input terminal of the capacitor array circuit receives the input voltage signal, and the capacitor array circuit adjusts the input voltage signal according to a successive approximation control signal to generate an adjusted voltage; a voltage comparator, wherein a first receiving terminal thereof receives the adjusted voltage, a second receiving terminal of the voltage comparator receives a second reference voltage, and the voltage comparator compares voltage levels of the adjusted voltage and the second reference voltage to generate a comparison signal; and a successive approximation circuit generating the successive approximation control signal according to the comparison signal to generate the output digital signal corresponding to the input voltage signal. According to some embodiments, the successive approximation circuit includes: a successive approximation register for temporarily storing a digital code; and a logic controller coupled to the successive approximation register, wherein the logic controller counts a count value, adjusts the digital code according to the count value and the comparison signal, and generates the successive approximation control signal according to the digital code, and when the count value reaches a conversion bit value, the logic controller uses an adjusted digital code as the output digital signal of the signal processing circuit. According to some embodiments, the capacitor array circuit includes: a plurality of capacitors, wherein a first terminal of each of the capacitors is coupled to the input terminal of the capacitor array circuit; and a plurality of capacitive switches, wherein an input terminal of each of the capacitive switches is respectively coupled to a second terminal of each of the corresponding capacitors, a first output terminal of each of the capacitive switches receives the first reference voltage, a second output terminal of each of the capacitive switches receives a third reference voltage, and a control terminal of each of the capacitive switches is respectively coupled to the corresponding successive approximation control signal.

According to some embodiments, a control method of an in-memory computing device is provided, wherein the in-memory computing device includes a memory array and a plurality of analog-to-digital conversion circuits. The control method includes: dividing the analog-to-digital conversion circuits into a plurality of analog-to-digital conversion circuit groups, wherein each of the analog-to-digital conversion circuit groups includes at least two of the analog-to-digital conversion circuits; and controlling the analog-to-digital conversion circuits so that during an operation enable period of the analog-to-digital conversion circuits, corresponding enable periods of the analog-to-digital conversion circuit groups are not overlapped with each other. According to some embodiments, the steps of controlling the analog-to-digital conversion circuits further include: generating an end signal via one of the analog-to-digital conversion circuit groups at a previous stage after a signal conversion is completed; and controlling another one of the analog-to-digital conversion circuit groups at a later stage to enter the corresponding enable period after receiving the end signal transmitted by one of the analog-to-digital conversion circuit groups of the previous stage to successively perform the signal conversion. According to some embodiments, the in-memory computing device further includes: a plurality of digital-to-analog conversion circuits coupled to the memory array, wherein the digital-to-analog conversion circuits respectively receive a plurality of input digital signals to generate a plurality of input analog signals, and the memory array receives the input analog signals to generate a plurality of computed analog signals using an in-memory computation. According to some embodiments, an operation enable period of the digital-to-analog conversion circuits and the operation enable period of the analog-to-digital conversion circuits are staggered with each other and are not overlapped with each other. According to some embodiments, the digital-to-analog conversion circuits perform a signal conversion at the same time during an operation enable period.

According to some embodiments, the in-memory computing device further includes: a first reference voltage generator coupled to the analog-to-digital conversion circuits, wherein the reference voltage generator provides a first reference voltage to one of the analog-to-digital conversion circuit groups at each time point during the operation enable period; and a second reference voltage generator coupled to the analog-to-digital conversion circuits, wherein the reference voltage generator provides a second reference voltage to one of the analog-to-digital conversion circuit groups at each time point during the operation enable period.

It should be appreciated that the following embodiment(s) of the present disclosure provides applicable concepts that can be embodied in a wide variety of specific contexts. The embodiments are intended to provide further explanations but are not used to limit the scope of the present disclosure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A signal processing circuit, comprising:
   a plurality of analog-to-digital conversion circuits, wherein each of the analog-to-digital conversion circuits comprises:
      a reset switch, wherein a first terminal thereof receives a first reference voltage, and a second terminal of the reset switch receives an input voltage signal;
      a capacitor array circuit, wherein a reference voltage terminal thereof receives the first reference voltage, an input terminal of the capacitor array circuit receives the input voltage signal, and the capacitor array circuit adjusts the input voltage signal according to a successive approximation control signal to generate an adjusted voltage;
      a voltage comparator, wherein a first receiving terminal thereof receives the adjusted voltage, a second receiving terminal of the voltage comparator receives a second reference voltage, and the voltage comparator compares voltage levels of the adjusted voltage and the second reference voltage to generate a comparison signal; and
      a successive approximation circuit coupled to the voltage comparator and the capacitor array circuit, wherein the successive approximation circuit generates the successive approximation control signal according to the comparison signal and generates an output digital signal corresponding to the input voltage signal,
   wherein the capacitor array circuit maintains the input voltage signal during a non-reset stage,
   wherein the analog-to-digital conversion circuits are divided into a plurality of analog-to-digital conversion circuit groups, and each of the analog-to-digital conversion circuit groups comprises at least two of the analog-to-digital conversion circuits, and during an operation enable period of the analog-to-digital conversion circuits, corresponding enable periods of the analog-to-digital conversion circuit groups are not overlapped with each other, and the analog-to-digital conversion circuits in the analog-to-digital conversion circuit groups convert a portion of a plurality of analog signals into a portion of an output digital signal during the corresponding enable periods.

2. The signal processing circuit of claim 1, wherein the signal processing circuit is applied to an in-memory computing device, and, the in-memory computing device further comprises:

a memory array comprising a plurality of memory cells, wherein the analog-to-digital conversion circuit is coupled to one of the memory cells in the memory array, and the input voltage signal is generated by one of the plurality of memory cells in the memory array.

3. The signal processing circuit of claim 1, wherein the successive approximation circuit comprises:

a successive approximation register for temporarily storing a digital code; and a logic controller coupled to the successive approximation register, wherein the logic controller counts a count value, adjusts the digital code according to the count value and the comparison signal, and generates the successive approximation control signal according to the digital code, when the count value reaches a conversion bit value, the logic controller uses an adjusted digital code as the output digital signal of the signal processing circuit.

4. The signal processing circuit of claim 1, wherein the capacitor array circuit comprises:

a plurality of capacitors, wherein a first terminal of each of the capacitors is coupled to the input terminal of the capacitor array circuit; and a plurality of capacitive switches, wherein an input terminal of each of the capacitive switches is respectively coupled to a second terminal of each of the corresponding capacitors, a first output terminal of each of the capacitive switches receives the first reference voltage, a second output terminal of each of the capacitive switches receives a third reference voltage, and a control terminal of each of the capacitive switches is respectively coupled to the corresponding successive approximation control signal.

5. An in-memory computing device, comprising:

a plurality of digital-to-analog conversion circuits respectively receiving a plurality of input digital signals to generate a plurality of input analog signals;

a memory array coupled to the digital-to-analog conversion circuits, wherein the memory array receives the input analog signals to generate a plurality of computed analog signals using an in-memory computation; and a plurality of analog-to-digital conversion circuits coupled to the memory array, wherein the analog-to-digital conversion circuits are divided into a plurality of analog-to-digital conversion circuit groups, and each of the analog-to-digital conversion circuit groups comprises at least two of the analog-to-digital conversion circuits, during an operation enable period of the analog-to-digital conversion circuits, corresponding enable periods of the analog-to-digital conversion circuit groups are not overlapped with each other, and the analog-to-digital conversion circuits in the analog-to-digital conversion circuit groups convert a portion of the computed analog signals into a portion of an output digital signal during the corresponding enable periods.

6. The in-memory computing device of claim 5, wherein one of the analog-to-digital conversion circuit groups at a previous stage generates an end signal after a signal conversion is completed and transmits the end signal to another of the analog-to-digital conversion circuit groups at a later stage.

7. The in-memory computing device of claim 6, wherein the other one of the analog-to-digital conversion circuit groups at the later stage enters the corresponding enable period to perform the signal conversion after receiving the end signal transmitted by one of the analog-to-digital conversion circuit groups at the previous stage.

8. The in-memory computing device of claim 5, further comprising:

a first reference voltage generator coupled to the analog-to-digital conversion circuits, wherein the reference voltage generator provides a first reference voltage to one of the analog-to-digital conversion circuit groups at each time point during the operation enable period.

9. The in-memory computing device of claim 8, further comprising:

a second reference voltage generator coupled to the analog-to-digital conversion circuits, wherein the reference voltage generator provides a second reference voltage to one of the analog-to-digital conversion circuit groups at each time point during the operation enable period.

10. The in-memory computing device of claim 5, wherein an operation enable period of the digital-to-analog conversion circuits and the operation enable period of the analog-to-digital conversion circuits are staggered with each other and are not overlapped with each other.

11. The in-memory computing device of claim 5, wherein the digital-to-analog conversion circuits perform a signal conversion at the same time during an operation enable period.

12. The in-memory computing device of claim 5, wherein each of the analog-to-digital conversion circuits comprises:

a reset switch, wherein a first terminal thereof is coupled to a system voltage terminal;

a first capacitor, wherein a first terminal thereof is coupled to a second terminal of the reset switch, and a second terminal of the first capacitor is coupled to the system voltage terminal;

a control switch, wherein a first terminal thereof is coupled to the first terminal of the first capacitor and the second terminal of the reset switch, a second terminal of the control switch receives an input voltage signal, and the input voltage signal is generated by one of a plurality of memory cells in the memory array;

a capacitor array circuit, wherein a power supply terminal thereof receives a first reference voltage, an input terminal of the capacitor array circuit receives the input voltage signal, and the capacitor array circuit adjusts the input voltage signal according to a successive approximation control signal to generate an adjusted voltage;

a voltage comparator, wherein a first receiving terminal thereof receives the adjusted voltage, a second receiving terminal of the voltage comparator receives a second reference voltage, and the voltage comparator compares voltage levels of the adjusted voltage and the second reference voltage to generate a comparison signal; and a successive approximation circuit generating the successive approximation control signal according to the comparison signal to generate the output digital signal corresponding to the input voltage signal.

13. The in-memory computing device of claim 11, wherein the successive approximation circuit comprises:
a successive approximation register for temporarily storing a digital code; and
a logic controller coupled to the successive approximation register,
wherein the logic controller counts a count value, adjusts the digital code according to the count value and the comparison signal, and generates the successive approximation control signal according to the digital code,
when the count value reaches a conversion bit value, the logic controller uses an adjusted digital code as the output digital signal of the signal processing circuit.

14. The in-memory computing device of claim 11, wherein the capacitor array circuit comprises:
a plurality of capacitors, wherein a first terminal of each of the capacitors is coupled to the input terminal of the capacitor array circuit; and
a plurality of capacitive switches,
wherein an input terminal of each of the capacitive switches is respectively coupled to a second terminal of each of the corresponding capacitors, a first output terminal of each of the capacitive switches receives the first reference voltage, a second output terminal of each of the capacitive switches receives a third reference voltage, and a control terminal of each of the capacitive switches is respectively coupled to the corresponding successive approximation control signal.

15. A control method of an in-memory computing device, wherein the in-memory computing device comprises a memory array and a plurality of analog-to-digital conversion circuits,
the control method comprising:
generating a plurality of input analog signals according to a plurality of input digital signals;
generating a plurality of computed analog signals using an in-memory computation according to the input analog signals;
dividing the analog-to-digital conversion circuits into a plurality of analog-to-digital conversion circuit groups, wherein each of the analog-to-digital conversion circuit groups comprises at least two of the analog-to-digital conversion circuits; and
controlling the analog-to-digital conversion circuits so that during an operation enable period of the analog-to-digital conversion circuits, corresponding enable periods of the analog-to-digital conversion circuit groups are not overlapped with each other, and the analog-to-digital conversion circuits in the analog-to-digital conversion circuit groups convert a portion of the computed analog signals into a portion of an output digital signal during the corresponding enable periods.

16. The control method of claim 15, wherein the step of controlling the analog-to-digital conversion circuits further comprises:
generating an end signal via one of the analog-to-digital conversion circuit groups at a previous stage after a signal conversion is completed; and
controlling another of the analog-to-digital conversion circuit groups at a later stage to enter the corresponding enable period after receiving the end signal transmitted by one of the analog-to-digital conversion circuit groups at a previous stage to successively perform the signal conversion.

17. The control method of claim 15, wherein the in-memory computing device further comprises:
a plurality of digital-to-analog conversion circuits coupled to the memory array,
wherein the digital-to-analog conversion circuits respectively receive the plurality of input digital signals to generate the plurality of input analog signals,
the memory array receives the input analog signals to generate the plurality of computed analog signals using an in-memory computation.

18. The control method of claim 17, wherein an operation enable period of the digital-to-analog conversion circuits and the operation enable period of the analog-to-digital conversion circuits are staggered with each other and are not overlapped with each other.

19. The control method of claim 17, wherein the digital-to-analog conversion circuits perform a signal conversion at the same time during an operation enable period.

20. The control method of claim 15, wherein the in-memory computing device further comprises:
a first reference voltage generator coupled to the analog-to-digital conversion circuits, wherein the reference voltage generator provides a first reference voltage to one of the analog-to-digital conversion circuit groups at each time point during the operation enable period; and
a second reference voltage generator coupled to the analog-to-digital conversion circuits, wherein the reference voltage generator provides a second reference voltage to one of the analog-to-digital conversion circuit groups at each time point during the operation enable period.

* * * * *